United States Patent [19]

Hosoda et al.

[11] Patent Number: 4,717,436
[45] Date of Patent: Jan. 5, 1988

[54] WIRE FOR BONDING A SEMICONDUCTOR DEVICE

[75] Inventors: Naoyuki Hosoda, Osaka; Masaki Morikawa, Iwatsuki; Naoki Uchiyama, Osaka; Hideaki Yoshida, Kasukabe; Toshiaki Ono, Osaka, all of Japan

[73] Assignee: Mitsubishi Kinzoku Kabushiki Kaisha, Tokyo, Japan

[21] Appl. No.: 36,249

[22] Filed: Apr. 9, 1987

Related U.S. Application Data

[62] Division of Ser. No. 844,350, Mar. 26, 1986, Pat. No. 4,676,827.

[30] Foreign Application Priority Data

Mar. 27, 1985 [JP] Japan .................. 60-62974
Nov. 8, 1985 [JP] Japan .................. 60-250410
Feb. 20, 1986 [JP] Japan .................. 61-35627

[51] Int. Cl.⁴ .................................... C22C 9/00
[52] U.S. Cl. .................... 148/432; 420/469; 420/499; 420/500; 428/606
[58] Field of Search ............ 420/469, 492, 494, 499, 420/500; 148/432; 428/606

[56] References Cited

U.S. PATENT DOCUMENTS

| | | | |
|---|---|---|---|
| 2,743,199 | 4/1956 | Hull .................... | 75/65 ZM |
| 3,525,605 | 8/1970 | Pynna et al. ............ | 420/469 |
| 4,497,324 | 10/1984 | Cline .................. | 75/65 ZM |
| 4,537,743 | 8/1985 | Yamanaka et al. ......... | 420/469 |
| 4,537,745 | 8/1985 | Hässler et al. .......... | 420/469 |
| 4,676,827 | 6/1987 | Hosoda et al. .......... | 75/65 ZM |

OTHER PUBLICATIONS

*Metal Progress* Databook, Mid-Jun. 1978, pp. 90-91.

Primary Examiner—L. D. Rutledge
Assistant Examiner—George Wyszomerski
Attorney, Agent, or Firm—Frishauf, Holtz, Goodman & Woodward

[57] ABSTRACT

The present invention eliminates the problems associated with the use of oxygen-free copper and other high-purity copper materials as bonding wires. In accordance with one aspect of the present invention, at least one rare earth element, or at least one element selected from the group consisting of Mg, Ca, Ti, Zr, Hf, Li, Na, K, Rb and Cs, or the combination of at least one rare earth element and at least one elemented selected from the above-specified group is incorporated in high-purity copper as a refining component in an amount of 0.1–100 ppm on a weight basis, and the high-purity copper is subsequently refined by zone melting. The very fine wire drawn from the so refined high-purity copper has the advantage that it can be employed in high-speed ball bonding of a semiconductor chip with a minimum chance of damaging the bonding pad on the chip by the ball forming at the tip of the wire.

In accordance with another aspect of the present invention, 0.5–3 ppm of a rare earth element and/or Y is further incorporated as an alloying component in the zone-refined high-purity copper.

2 Claims, No Drawings

WIRE FOR BONDING A SEMICONDUCTOR DEVICE

This is a division of application Ser. No. 844,350, filed Mar. 26, 1986, now U S. Pat. No. 4,676,827.

TECHNICAL FIELD

The present invention relates to a very fine wire of high-purity copper for use in the bonding of a semiconductor, as well as a process for producing such a bonding wire.

BACKGROUND ART

ICs as semiconductor devices, which term also includes transistors, LSIs and VLSIs, are typically fabricated by the following steps:
(a) provide a lead frame material that is made of a strip of Cu alloy having a thickness of 0.1–0.3 mm;
(b) etch or stamp out a lead frame conforming to the shape of the ICs to be fabricated;
(c) apply high-purity Si or Ge semiconductor chips to selected areas in the lead frame by thermocompression with an electrically conductive resin such as Ag paste, or by soldering with a plating of Au, Ag, Ni, Cu or an alloy thereof formed on the mating surfaces of each semiconductor chip and the lead frame, or by Au brazing;
(d) perform ball bonding to connect each semiconductor chip to the lead frame by bridging them with very fine (20–50 μm diameter) Au wires;
(e) enclose with a protective plastic package the semiconductor chips, bonded gold wires and parts of the lead frame to which the chips have been bonded; and
(f) cut the lead frame into discrete ICs.

Since the Au wires conventionally employed as bonding wires in the fabrication of semiconductor devices are expensive, substantial reduction in the manufacturing cost can be realized by replacing the Au wires with much less expensive Cu wires. In order to materialize this possibility, attempts are being made to use bonding wires made of oxygen-free copper and other high-purity copper materials having comparatively low hardness values.

By repeated cycles of electrorefining, the purity of copper materials can be increased to at least 99.999% (5-nines or 5 N purity). However, even if this high-purity copper material after being further purified by 20–30 cycles of zone melting, is annealed to the fullest extent, its Vickers hardness (Hv) lies in the rang of about 45 to 48 and is not as low as the value for the softer Au (Hv=30). If high-speed ball bonding is performed with this relatively hard Cu wire (0.15–0.3 second intervals between bonding cycles are common with very fine Au wires), the ball forming at the tip of the wire may break the bonding pad of Al alloy on the semiconductor chip, or may even sometimes cause microcracking in the chip.

SUMMARY OF THE INVENTION

One object, therefore, of the present invention is to provide a process for producing a very fine wire of high-purity copper which can be employed in high-speed ball bonding with a minimum chance of the surface of the semiconductor chip being damaged.

Another object of the present invention is to provide a process for producing a bonding wire which, in addition to the aforementioned advantage, can be subjected to repeated heat cycles such as are experienced in the service environment of ICs with a minimum chance of the wire breaking at the neck just above the bonded ball.

A further object of the present invention is to provide a bonding wire that is produced by one of the aforementioned methods and which can be used as an industrially acceptable alternative to the very fine Au wire.

These objects of the present invention can be attained by the following.

(1) A process for producing a wire for use in the bonding of a semiconductor device, said process comprising providing an ingot of high-purity copper which contains 0.1–100 ppm on a weight basis of the following refining component:
  at least one rare earth element; or
  at least one element selected from the group consisting of Mg, Ca, Ti, Zr, Hf, Li, Na, K, Rb and Cs; or
  at least one rare earth element in combination with at least one element selected from the group consisting of Mg, Ca, Ti, Zr, Hf, Li, Na, K, Rb and Cs,
  and refining said copper ingot by zone melting.

(2) A process for producing a wire for use in the bonding of a semiconductor device, said process comprising providing an ingot of high-purity copper which contains 0.1–100 ppm on a weight basis of at least one refining component selected from the group consisting of Mg, Ca, Ti, Zr, Hf, Li, Na, K, Rb and Cs, subsequently refining said copper ingot by zone melting to obtain a refined high-purity copper, and incorporating in said refined copper 0.5–3 ppm of at least one alloying component selected from the group consisting of a rare earth element and Y.

(3) A very fine wire for use in the bonding of a semiconductor device which is made of high-purity copper containing no more than 0.1 ppm of each of S, Se and Te, with the total content of these and any other incidental impurities present being held at a level not exceeding 0.3 ppm.

(4) A very fine wire for use in the bonding of a semiconductor device which is made of high-purity copper that contains 0.5–3 ppm of at least one of Y and a rare earth element as an alloying component, with the balance being Cu and incidental impurities which include no more than 0.2 ppm of S, no more than 0.1 ppm of Se and no more than 0.1 ppm of Te, with the total content of these and any other incidental impurities present being held at a level not exceeding 1 ppm.

DETAILED DESCRIPTION OF THE INVENTION

With a view to attaining the objects described hereinbefore, the present inventors made intensive studies of the defects associated with the use of very fine wires of oxygen-free copper in the bonding of semiconductor devices. As a result, the inventors obtained the following observations.

(a) The ball forming at the tip of a very fine Au wire will not experience a significant change in hardness even if it is thermocompressed in the rapid bonding process. On the other hand, the ball forming at the tip of a very fine wire of oxygen-free copper becomes very hard as a result of work hardening due to thermocompression of the ball. The hardened ball is highly prone to damage the semiconductor chip per se or the bonding pad on its surface.

(b) The degree of work hardening of the ball at the tip of the very fine wire of oxygen-free copper which results from thermocompression cycles in the rapid bonding process varies considerably depending upon the concentrations of S, Se and Te present as incidental impurities.

(c) If the purity of oxygen-free copper is increased while the levels of S, Se and Te are reduced by combined electrorefining and zone refining techniques, the increase in the hardness of the ball at the wire tip that results from thermocompression cycles in rapid ball bonding can be reduced, whereby the frequency of occurrence of the problems mentioned in (a) is reduced but can by no means be eliminated completely.

(d) The very fine wires made of the high-purity copper obtained by combined electrorefining and zone refining techniques contain about 0.3-5 ppm of each of S, Se and Te as an incidental impurity and the levels of these impurities cannot be lowered any further by repeating the aforementioned refining techniques. However, if a rare earth element, or at least one of Ti, Zr, Hf, Mg, Ca, Li, Na, K, Rb and Cs, or both a rare earth element and at least one of the above-listed elements are incorporated in the high-purity copper as refining components in amounts of 0.1-100 ppm on a weight basis, S, Se and Te will form a sulfide, selenide and Te compound, respectively, during subsequent zone refining and will separate from the copper matrix, leaving no more than 0.1 ppm of each of these impurities within the high-purity copper. At the same time, other incidental impurities such as Ag, Si, Fe, Ni, Co, Sn, Mn and Zn are removed by zone melting, with the result that the total content of the impurities present in the ingot is reduced to a level not exceeding 0.3 ppm. A very fine wire made of the so treated high-purity copper containing extremely low levels of incidental impurities can be used in high-speed ball bonding while the chance of the ball being work-hardened as a result of thermocompression is reduced to such a low level that the possibility of the ball damaging the semiconductor chip or the bonding pad on it is substantially eliminated.

As a result of their continued studies based on these finding, the present inventors made one more observation which is described below.

(e) Even the very fine wire made of the high-purity copper which is obtained in accordance with (d) has a high incidence of breaking which occurs at the neck just above the bonded ball when the semiconductor device is placed within the environment in which it operates, and the incidence of such trouble depends on the type of the semiconductor device or the molding resin with which it is packaged. In order to avoid this problem, either a rare earth element or Y or both are incorporated in the high-purity copper of (d) as an alloying component in an amount ranging from 0.5 to 3 ppm, and at the same time, the levels of S, Se and Te as incidental impurities are reduced to levels not exceeding 0.2 ppm, 0.1 ppm and 0.1 ppm, respectively, with the total content of these and any other incidental impurities present being held to a level not exceeding 1 ppm. A very fine wire made of the resulting Cu copper may be used in high-speed ball bonding and attains the following advantages: the ball forming at the tip of the wire experiences a minimum degree of work hardening as a result of thermocompression; the ball has an inherently low value of Vickers hardness; and the occurrence of breaking at the neck just above the bonded ball is reduced to a very low level.

The criticality for the amount of the refining component added to high-purity copper, and that of the alloying component incorporated in the zone-refined high-purity copper are described hereinafter.

The refining component added to high-purity copper will combine with S, Ag and other incidental impurities present in the copper and the resulting compounds will be readily eliminated by subsequent zone refining treatment. If the amount of the refining component is less than 0.1 ppm, the high-purity copper will not acquire the desired softness; on the other hand, if more than 100 ppm of the refining component is added, an increasing amount of the refining component remains as a residual alloying component, leading to an increase in the hardness of the zone-refined high-purity copper. Therefore, the refining component should be added in an amount within the limits of 0.1 and 100 ppm. Enhanced refining is ensured by using a rare earth element in combination with at least one of Mg, Ca, Ti, Zr, Hf, Li, Na, K, Rb and Cs.

The alloying component which is either a rare earth element or Y or both is incorporated in the zone-refined high-purity copper in an amount within the range of 0.5 to 3 ppm. If the content of this alloying component is less than 0.5 ppm, it is insufficient to prevent the frequent wire breaking that results from the coarsening of crystal grains in the neck just above the bonded ball of the wire. If, on the other hand, the content of the alloying component exceeds 3 ppm, the ball forming at the tip of the wire will be work-hardened to such an appreciable extent as a result of thermocompression that it becomes practically impossible to perform high-speed ball bonding. The upper limit of the content of each of S, Se and Te as an incidental impurity and that of the total content of these and any other incidental impurities present have been determined empirically, and if these upper limits are exceeded, it becomes impossible to avoid the occurrence of the problems encountered with the conventional very fine wire of oxygen-free copper.

The following examples are provided for the purpose of illustrating the advantages of the present invention.

EXAMPLE 1

Re-electrolytic copper with 99.999% purity (S, 5 ppm; Ag, 3 ppm) was provided and re-melted in a vacuum smelting furnace. To the melt, one or more refining components (see Table 1) were added in the amounts shown in Table 1. Each of the melts was cast into an ingot (10 mm$^2$×250 mm long ), which then was refined by five cycles of zone melting in vacuum. By these procedures, 46 ingot samples of very soft copper were prepared.

A test specimen was cut from the end of each ingot where the zone refining treatment had started. This specimen was annealed by heating at 600° C. for 30 minutes and subsequently etched with nitric acid. The etched specimen was then checked for its Vickers hardness. The results of measurements are shown in Table 1, which also lists the initial values (i.e., before zone refining).

Two ingots of high-purity copper having the same dimensions as specified above were provided as comparative samples: one ingot was cast from re-electrolytic copper (5 N purity; S, 5 ppm; Ag, 3 ppm), and the other ingot was cast from this re-electrolytic copper after it was subjected to another electrorefining cycle. After measuring the Vickers hardness of each ingot, it was refined by zone melting under the conditions described above, thereby producing sample Nos. 1 and 2.

A test specimen was cut form each sample, annealed and acid-etched as in the above in preparation for another measurement of Vickers hardness. The results are also shown in Table 1.

The Hv values of samples Nos. 1 to 14 and 31 to 46, as well as comparative sample Nos. 1 and 2 revealed that the acid etching was insufficient to eliminate the workhardening effect that had been introduced by the machining and polishing strains caused when the specimens were cut from the ingots. Therefore, the specimens were acid-etched again before making another measurement of their Hv values. As for the re-etched specimens, two Hv values are listed in Table 1, with the value obtained after the first etching being put in parentheses.

As is clear from Table 1, ingot sample Nos. 1 to 46 of the present invention had a very low degree of hardness (Hv<40). On the other hand, comparative sample Nos. 1 and 2 which incorporated none of the refining components specified by the present invention were not able to attain a significant reduction in hardness even after refining by zone melting.

EXAMPLE 2

An ingot of oxygen-free copper having the impurity levels shown in Table 2 was provided. Two ingots of high-purity copper were also prepared, one by subjecting the oxygen-free copper to electrorefining and the other by subjecting the same oxygen-free copper to zone refining. The impurity levels in these additional ingots are also indicated in Table 2. The ingot of electrorefined high-purity copper was re-melted in a vacuum smelting furnace. To the melt, one or more refining components (see Table 2) were added in the amounts shown in Table 2. Each of the melts was cast into an ingot (10 mm$^2$×250 mm long), which then was refined by five cycles of zone melting in vacuum. A 100-mm long sample was cut from the end of each ingot where the zone refining treatment had started. By these procedures, 42 ingot samples of the refined copper of the present invention having the impurity levels shown in Table 2 were prepared. Each of the ingots (i.e., oxygen-free copper, electrorefined high-purity copper, zone-refined high-purity copper, and the high-purity copper of the present invention) was drawn into a very fine

TABLE 1

| Sample No. | | Refining component (ppm) | Vickers hardness | |
|---|---|---|---|---|
| | | | Before zone melting | After zone melting |
| Samples of the invention | 1 | La: 0.15 | 47.4 (55.0) | 38.4 (49.2) |
| | 2 | La: 20 | 47.8 (54.9) | 35.3 (42.6) |
| | 3 | La: 42 | 47.5 (54.8) | 37.3 (44.8) |
| | 4 | La: 63 | 48.0 (55.3) | 37.9 (45.4) |
| | 5 | La: 98 | 49.9 (57.1) | 39.5 (48.9) |
| | 6 | Ce: 7 | 46.9 (54.5) | 36.8 (44.6) |
| | 7 | Ce: 30 | 47.3 (54.8) | 35.8 (43.5) |
| | 8 | Ce: 52 | 48.6 (55.9) | 37.6 (45.1) |
| | 9 | Ce: 86 | 49.4 (56.8) | 39.1 (48.7) |
| | 10 | Nd: 15, Pr: 3, La: 1 | 47.8 (55.2) | 35.5 (43.1) |
| | 11 | La: 16, Ce: 10 | 48.4 (55.9) | 36.1 (43.8) |
| | 12 | Pr: 11, La: 7, Sm: 1 | 48.9 (56.1) | 36.2 (43.6) |
| | 13 | Ce: 0.52, Nd: 0.18, La: 0.24 | 47.8 (55.0) | 39.0 (48.4) |
| | 14 | Ce: 45, Nd: 17, Pr: 5, La: 25 | 49.3 (56.9) | 39.3 (49.1) |
| | 15 | Li: 0.13 | 47.6 | 36.1 |
| | 16 | Li: 42 | 49.2 | 36.4 |
| | 17 | Na: 2 | 46.8 | 36.0 |
| | 18 | Na: 91 | 50.2 | 37.5 |
| | 19 | K: 2 | 47.1 | 36.0 |
| | 20 | K: 43 | 48.8 | 36.9 |
| | 21 | Rb: 1 | 46.9 | 35.4 |
| | 22 | Rb: 87 | 50.3 | 37.2 |
| | 23 | Cs: 0.6 | 46.8 | 36.6 |
| | 24 | Cs: 89 | 50.4 | 35.8 |
| | 25 | Li: 30, Na: 33 | 50.2 | 36.7 |
| | 26 | Li: 9, Na: 3, K: 20 | 48.3 | 36.3 |
| | 27 | Na: 23, K: 10, Rb: 20, Cs: 25 | 49.3 | 37.2 |
| | 28 | Li: 19, La: 2 | 48.9 | 35.5 |
| | 29 | K: 22, Ce: 49 | 48.0 | 36.1 |
| | 30 | Na: 13, Cs: 10, Ce: 20, Nd: 8, La: 8 | 50.1 | 35.4 |
| | 31 | Mg: 0.15 | 46.9 (54.5) | 37.2 (45.0) |
| | 32 | Mg: 40 | 48.5 (56.0) | 37.5 (45.2) |
| | 33 | Ca: 2 | 47.2 (54.6) | 37.3 (44.9) |
| | 34 | Ca: 95 | 48.7 (55.8) | 37.8 (45.1) |
| | 35 | Ti: 2 | 47.3 (54.9) | 37.0 (44.8) |
| | 36 | Ti: 45 | 48.2 (55.3) | 38.1 (45.4) |
| | 37 | Zr: 1 | 47.3 (54.6) | 36.9 (44.4) |
| | 38 | Zr: 88 | 48.9 (56.0) | 38.7 (46.0) |
| | 39 | Hf: 0.5 | 47.0 (54.6) | 37.6 (45.4) |
| | 40 | Hf: 90 | 48.6 (56.1) | 36.6 (44.5) |
| | 41 | Mg: 30, Ca: 35 | 49.6 (56.8) | 36.9 (44.3) |
| | 42 | Mg: 10, Ca: 3, Ti: 20 | 48.0 (55.2) | 37.8 (45.2) |
| | 43 | Ca: 26, Ti: 10, Zr: 20, Hf: 26 | 49.8 (57.3) | 37.0 (44.7) |
| | 44 | Mg: 20, La: 2 | 47.3 (54.5) | 36.7 (44.1) |
| | 45 | Ti: 23, Ce: 50 | 49.6 (56.9) | 36.5 (44.0) |
| | 46 | Ca: 15, Hf: 10, Ce: 20, Nd: 8, La: 10 | 48.6 (55.8) | 36.7 (44.1) |
| Comparative samples | 1 | (Re-electrolytic copper) | 47.9 (55.2) | 46.6 (54.1) |
| | 2 | (Re-electrolytic copper subjected to another cycle of electro-refining) | 46.1 (53.2) | 44.7 (52.0) | wire (25 μdiameter) by repeated cycles of conventional hot and cold rolling techniques.

For each of the wire samples, a ball was formed at the wire tip by solidification and the Vickers hardness of a cross section of that ball was measured. Thereafter, the wires were ball-bonded to the bonding pad of Al alloy on Si semiconductor chips at high speed (0.15-second interval between two bondings). After $10^4$ bonding cycles, the number of times that damage occurred to the bonding pad was counted, and the Vickers hardness of the ball bonded to the pad was also measured. In Hv measurement, a cross section was cut through the ball, care being taken not to cause any strain, and, after etching, the Hv value was measured with a very fine model of micro-Vickers hardness meter capable of very fine measurement. The results are shown in Table 2.

TABLE 2

| Sample No. | | Refining component (ppm) | Impurity levels (ppm) | | | | Ball hardness (Hv) | | Frequency of damage to banding pad |
|---|---|---|---|---|---|---|---|---|---|
| | | | S | Se | Te | total | Before thermo-compression | After thermo-compression | |
| wire of oxygen-free copper | | | 10 | 1 | 1 | 37 | 48 | 56 | 983 |
| wire of electro-refined high-purity copper | | | 5 | 0.5 | 0.5 | 26 | 38 | 50 | 510 |
| wire of zone-refined high-purity copper | | | 1 | 0.3 | 0.3 | 6.6 | 38 | 48 | 103 |
| Samples of the invention | 1 | La: 0.15 | 0.08 | 0.01 | 0.01 | 0.24 | 38 | 44 | 1 |
| | 2 | La: 9.2 | 0.03 | <0.01 | <0.01 | 0.14 | 38 | 42 | 0 |
| | 3 | La: 40.3 | <0.01 | <0.01 | <0.01 | 0.02 | 38 | 40 | 0 |
| | 4 | La: 95.0 | <0.01 | <0.01 | <0.01 | 0.06 | 38 | 42 | 0 |
| | 5 | Ce: 0.20 | 0.09 | 0.01 | 0.01 | 0.11 | 38 | 45 | 2 |
| | 6 | Ce: 8.1 | 0.04 | <0.01 | <0.01 | 0.05 | 38 | 43 | 0 |
| | 7 | Ce: 30.2 | 0.01 | <0.01 | <0.01 | 0.02 | 38 | 41 | 0 |
| | 8 | Ce: 90.1 | <0.01 | <0.01 | <0.01 | 0.03 | 38 | 42 | 0 |
| | 9 | Ti: 0.29 | 0.09 | 0.02 | 0.01 | 0.14 | 38 | 45 | 1 |
| | 10 | Ti: 5.0 | 0.03 | 0.01 | <0.01 | 0.14 | 38 | 43 | 0 |
| | 11 | Ti: 90.0 | 0.01 | <0.01 | <0.01 | 0.16 | 38 | 42 | 0 |
| | 12 | Zr: 0.19 | 0.09 | 0.03 | 0.01 | 0.16 | 38 | 45 | 1 |
| | 13 | Zr: 7.8 | 0.03 | 0.01 | 0.01 | 0.08 | 38 | 43 | 0 |
| | 14 | Zr: 81.0 | 0.01 | <0.01 | <0.01 | 0.04 | 38 | 41 | 0 |
| | 15 | Hf: 0.31 | 0.09 | 0.02 | 0.01 | 0.20 | 38 | 45 | 1 |
| | 16 | Hf: 10.3 | 0.02 | 0.01 | <0.01 | 0.13 | 38 | 42 | 0 |
| | 17 | Hf: 92.5 | <0.01 | <0.01 | <0.01 | 0.15 | 38 | 42 | 0 |
| | 18 | Ca: 0.21 | 0.09 | 0.02 | 0.01 | 0.24 | 38 | 45 | 0 |
| | 19 | Ca: 10.3 | 0.03 | 0.01 | <0.01 | 0.17 | 38 | 41 | 0 |
| | 20 | Ca: 98.1 | <0.01 | <0.01 | <0.01 | 0.09 | 38 | 41 | 0 |
| | 21 | Mg: 0.42 | 0.09 | 0.02 | 0.01 | 0.25 | 38 | 45 | 2 |
| | 22 | Mg: 9.0 | 0.04 | 0.01 | <0.01 | 0.15 | 38 | 44 | 1 |
| | 23 | Mg: 80.4 | 0.01 | <0.01 | <0.01 | 0.15 | 38 | 42 | 0 |
| | 24 | Li: 0.19 | 0.09 | 0.03 | 0.01 | 0.13 | 38 | 45 | 1 |
| | 25 | Li: 11.0 | 0.02 | 0.01 | <0.01 | 0.15 | 38 | 43 | 0 |
| | 26 | Li: 85.0 | <0.01 | <0.01 | <0.01 | 0.03 | 38 | 40 | 0 |
| | 27 | Nd: 20.1, Pr: 3.0, La: 2.0 | 0.05 | 0.01 | <0.01 | 0.18 | 38 | 43 | 0 |
| | 28 | La: 16.0, Ce: 10.2 | 0.04 | <0.01 | <0.01 | 0.15 | 38 | 43 | 0 |
| | 29 | Ce: 0.52, Nd: 0.02, La: 0.32 | 0.06 | 0.01 | 0.01 | 0.18 | 38 | 45 | 1 |
| | 30 | Ce: 45.1, Nd: 19.6, Pr: 5.1, La: 10.2 | 0.01 | <0.01 | <0.01 | 0.14 | 38 | 41 | 0 |
| | 31 | La: 10.0, Ti: 9.8 | 0.01 | <0.01 | <0.01 | 0.17 | 38 | 41 | 0 |
| | 32 | La: 11.7, Zr: 12.0 | <0.01 | <0.01 | <0.01 | 0.16 | 38 | 41 | 0 |
| | 33 | La: 25.1, Hf: 24.6 | <0.01 | <0.01 | <0.01 | 0.04 | 38 | 40 | 0 |
| | 34 | La: 10.2 Ca: 30.2 | <0.01 | <0.01 | <0.01 | 0.11 | 38 | 41 | 0 |
| | 35 | La: 20.0, Mg: 9.6 | <0.01 | <0.01 | <0.01 | 0.15 | 38 | 41 | 0 |
| | 36 | La: 22.3, Li: 10.3 | <0.01 | <0.01 | <0.01 | 0.02 | 38 | 40 | 0 |
| | 37 | Ti: 10.0, Ca: 20.4 | 0.01 | <0.01 | <0.01 | 0.07 | 38 | 42 | 0 |
| | 38 | Zr: 12.1, Mg: 9.6 | 0.01 | <0.01 | <0.01 | 0.16 | 38 | 42 | 0 |
| | 39 | Hf: 25.4, Li: 10.0 | <0.01 | <0.01 | <0.01 | 0.03 | 38 | 40 | 0 |
| | 40 | Ti: 5.0, Zr: 10.2, Hf: 5.1, Ca: 3.2, Mg: 6.1, Li: 4.1 | <0.01 | <0.01 | <0.01 | 0.02 | 38 | 40 | 0 |
| | 41 | La: 20.5, Zr: 10.5, Ca: 10.3, Mg: 3.2 Li: 2.6 | <0.01 | <0.01 | <0.01 | 0.04 | 38 | 40 | 0 |
| | 42 | La: 5.0, Nd: 8.2, Pr: 10.3, Ti: 10.5, Hf: 7.1, Mg: 3.0 | <0.01 | <0.01 | <0.01 | 0.05 | 38 | 40 | 0 |

As is clear from Table 2, wire samples Nos. 1 to 42 contained no more than 0.1 ppm of S, Se or Te, with the total content of incidental impurities being held at a level not exceeding 0.3 ppm. Therefore, the ball forming at the tip of each wire did not undergo any significant increase in hardness as a result of the thermocompression that was applied to effect ball bonding, and the incidence of the ball damaging the bonding pad on each semiconductor chip during high-speed bonding was nearly zero. On the other hand, the three comparative samples which were respectively made of oxygen-free copper, electrorefined high-purity copper and zone-refined high-purity copper had relatively high levels of S, Se and Te, with the total content of these and other incidental impurities present being higher than the upper limit specified by the present invention. As a result, the ball forming at the tip of each of these comparative wires experienced an appreciable increase in hardness as a result of the thermocompression that was applied to effect ball bonding, and caused frequent damage to the bonding pad during high-speed bonding.

In view of the substantial absence of damage caused to the bonding pad during high-speed ball bonding, the very fine wire which is made of the high-purity copper prepared in accordance with the present invention has adequate potential for use as a practical alternative to the very fine Au wire which is currently employed in the bonding of semiconductor devices.

EXAMPLE 3

An ingot of oxygen-free copper was provided; it contained S (6 ppm), Se (1 ppm) and Te (1 ppm) as incidental impurities and the total content of these and any other incidental impurities present was 37 ppm. This ingot was subjected to another cycle of electrorefining in order to reduce the S, Se and Te levels to 1 ppm, 0.3 ppm and 0.3 ppm, respectively, with the total content of incidental impurities being lowered to 10 ppm. The ingot of this high-purity electrolytic copper was re-melted in a vacuum smelting furnace and, to the melt, one or more refining components (see Table 3) was added in the amounts shown in Table 3. Each of the melts was cast into an ingot (10 mm$^2$×250 mm long), which then was refined by three to five cycles of zone melting in vacuum. A 100-mm long sample was cut from the end of each ingot where the zone refining treatment had started. By these procedures, ingots of refined high-purity copper having the impurity levels shown in Table 3 were obtained. The content of each of the refining components present in these ingots was no more than 0.1 ppm. The ingots of zone-refined high-purity copper were then melted in a vacuum smelting furnace and a rare earth element (see Table 3) and/or Y was incorporated in the melts in the amounts shown in Table 3. The melts were cast into ingots which then were drawn into very fine wires of Cu alloy (sample Nos. 1 to 33 of the present invention) by repeated cycles of hot and cold rolling steps. Each of the wires had a diameter of 25 μm and the S, Se and Te levels and total content of incidental impurities were substantially the same as those in the ingots of high-purity zone-refined copper from which these wires were prepared. Comparative very fine wires were drawn from the oxygen-free oxygen, electrorefined high-purity copper, and zone-refined high-purity copper under the same conditions as employed above.

The so prepared very fine wires were ball-bonded to the bonding pad of Al alloy on Si semiconductor chips at high speed (0.15-second intervals between bondings). In order to evaluate the change that occurred in the hardness of the ball forming at the tip of each wire as a result of thermocompression, the Vickers hardness of a cross section of the ball was measured both before and after the bonding operation. After 10$^4$ bonding cycles, the number of damages that occurred to the bonding pad was counted. In addition, a hundred 16-pin ICs in resin mold were subjected to 1,000 heat cycles (one cycle consisting of heating to 150° C. and subsequent cooling to −55° C.) in order to evaluate the durability of bonded wires in terms of the number of wires that brake at the neck just above the ball which was thermocompressed to form the bond. The results of the respective measurements are shown in Table 3.

In Hv measurement, a cross section was cut through the ball with care taken so as not cause any strain and, after acid etching, the Hv value was measured with a very fine model of micro-Vickers hardness meter.

TABLE 3

| Sample No. | | Refining component (ppm) | Impurity levels (ppm) | | | | Rare earth element as alloying component (ppm) | Ball hardness at cross section (Hv) | | Frequency of damage to bonding pad | Frequency of wire breaking (No. of breakings/ No. of tests) |
|---|---|---|---|---|---|---|---|---|---|---|---|
| | | | S | Se | Te | total | | Before thermo-compression | After thermo-compression | | |
| Cu alloy wires of the invention | 1 | La: 3.3 | 0.14 | 0.03 | 0.03 | 0.33 | La: 0.5 | 38 | 43 | 0 | 0/100 |
| | 2 | La: 35.1 | 0.12 | 0.02 | 0.02 | 0.52 | La: 1.0 | 38 | 44 | 0 | 0/100 |
| | 3 | La: 72.4 | 0.18 | 0.04 | 0.01 | 0.77 | La: 2.9 | 39 | 45 | 1 | 0/100 |
| | 4 | La: 98.8 | 0.04 | 0.05 | 0.09 | 0.25 | Ce: 0.6 | 38 | 41 | 0 | 0/100 |
| | 5 | Pr: 3.1 | 0.14 | 0.07 | 0.08 | 0.74 | Ce: 2.8 | 38 | 44 | 0 | 0/100 |
| | 6 | Ce: 3.2 | 0.14 | 0.02 | 0.06 | 0.45 | Pr: 0.5 | 39 | 41 | 0 | 1/100 |
| | 7 | Ce: 83.2 | 0.13 | 0.03 | 0.03 | 0.38 | Pr: 2.9 | 38 | 43 | 0 | 0/100 |
| | 8 | Ce: 92.6 | 0.05 | 0.02 | 0.02 | 0.29 | Nd: 0.5 | 38 | 42 | 0 | 0/100 |
| | 9 | Ti: 3.3 | 0.09 | 0.02 | 0.02 | 0.97 | Nd: 2.8 | 39 | 44 | 0 | 0/100 |
| | 10 | Ti: 23.5 | 0.11 | 0.04 | 0.02 | 0.35 | Sm: 0.5 | 38 | 43 | 0 | 0/100 |
| | 11 | Ti: 90.5 | 0.15 | 0.02 | 0.04 | 0.79 | Sm: 2.9 | 39 | 45 | 2 | 0/100 |
| | 12 | Zr: 3.2 | 0.19 | 0.08 | 0.03 | 0.60 | Eu: 0.5 | 38 | 42 | 0 | 1/100 |
| | 13 | Zr: 95.0 | 0.08 | 0.06 | 0.06 | 0.67 | Eu: 2.8 | 38 | 43 | 0 | 0/100 |
| | 14 | Hf: 3.1 | 0.09 | 0.02 | 0.09 | 0.64 | Gd: 0.6 | 38 | 42 | 0 | 1/100 |
| | 15 | Hf: 96.5 | 0.10 | 0.06 | 0.08 | 0.27 | Gd: 2.7 | 38 | 43 | 0 | 0/100 |
| | 16 | Ca: 3.3 | 0.02 | 0.05 | 0.02 | 0.44 | Tb: 0.5 | 39 | 42 | 0 | 2/100 |
| | 17 | Ca: 97.4 | 0.04 | 0.09 | 0.06 | 0.46 | Tb: 2.9 | 38 | 44 | 0 | 0/100 |
| | 18 | Mg: 3.1 | 0.16 | 0.08 | 0.09 | 0.48 | Dy: 1.0 | 38 | 42 | 0 | 1/100 |
| | 19 | Mg: 98.2 | 0.02 | 0.07 | 0.08 | 0.52 | Ho: 2.8 | 39 | 43 | 0 | 0/100 |
| | 20 | La: 2.8, Pr: 3.0, Nb: 15.0 | 0.09 | 0.05 | 0.02 | 0.67 | Er: 1.5 | 38 | 44 | 0 | 0/100 |
| | 21 | La: 10.6, Ce: 30.0 | 0.14 | 0.09 | 0.02 | 0.68 | Tm: 1.3 | 38 | 43 | 1 | 0/100 |
| | 22 | La: 1.5, Ti: 2.0 | 0.13 | 0.08 | 0.08 | 0.35 | Yb: 0.5 | 38 | 42 | 0 | 1/100 |
| | 23 | La: 30.0, Ca: 35.0 | 0.07 | 0.05 | 0.03 | 0.83 | Lu: 1.8 | 38 | 44 | 0 | 0/100 |

TABLE 3-continued

| Sample No. | Refining component (ppm) | Impurity levels (ppm) | | | | Rare earth element as alloying component (ppm) | Ball hardness at cross section (Hv) | | Frequency of damage to bonding pad | Frequency of wire breaking (No. of breakings/ No. of tests) |
|---|---|---|---|---|---|---|---|---|---|---|
| | | S | Se | Te | total | | Before thermo-compression | After thermo-compression | | |
| 24 | Ti: 10.0, Ca: 20.0 | 0.01 | 0.05 | 0.06 | 0.21 | Sc: 0.5 | 38 | 43 | 0 | 0/100 |
| 25 | Ce: 50.0, Ti: 45.0 | 0.06 | 0.02 | 0.02 | 0.77 | Sc: 2.8 | 38 | 44 | 1 | 0/100 |
| 26 | Li: 3.2 | 0.10 | 0.05 | 0.09 | 0.39 | Y: 0.5 | 38 | 42 | 0 | 2/100 |
| 27 | Li: 20.0 | 0.17 | 0.09 | 0.07 | 0.67 | Y: 2.8 | 39 | 44 | 0 | 0/100 |
| 28 | Li: 85.5 | 0.10 | 0.04 | 0.09 | 0.78 | La: 0.5, Ce: 1.8 | 38 | 45 | 1 | 0/100 |
| 29 | Zr: 12.0, Mg: 10.8 | 0.08 | 0.02 | 0.05 | 0.81 | Dy: 0.2, Er: 2.0, Lu: 0.5 | 38 | 45 | 2 | 0/100 |
| 30 | La: 20.6, Zr: 10.0, Ca: 10.0, Mg: 3.8 | 0.02 | 0.02 | 0.06 | 0.93 | Pr: 1.0, Gd: 1.0, Tb: 0.5 | 38 | 44 | 1 | 0/100 |
| 31 | Hf: 25.0, Li: 10.0 | 0.12 | 0.07 | 0.08 | 0.54 | Sc: 1.5, Y: 0.5 | 38 | 43 | 0 | 0/100 |
| 32 | Ti: 5.8, Zr: 5.6, Ca: 3.0, Mg: 3.0 | 0.13 | 0.05 | 0.04 | 0.66 | Ho: 0.3, Yb: 0.8 Er: 1.0 | 38 | 44 | 0 | 0/100 |
| 33 | La: 5.0, Nd: 8.0, Pr: 5.5, Ti: 10,5, Hf: 7.0, Mg: 3.5 | 0.14 | 0.09 | 0.03 | 0.82 | La: 0.5, Ce: 0.5, Pr: 0.8, Sm: 0.5 | 38 | 45 | 1 | 0/100 |
| wire of oxygen-free copper | — | — | — | — | — | — | 48 | 56 | 983 | 0/100 |
| wire or electro-refined high-purity copper | — | — | — | — | — | — | 38 | 50 | 510 | 0/100 |
| wire of zone-refined high-purity copper 1 | La: 3.3 | 0.14 | 0.03 | 0.03 | 0.33 | — | 38 | 40 | 0 | 28/100 |
| 2 | La: 30.0, Ca: 35.0 | 0.07 | 0.05 | 0.03 | 0.83 | — | 38 | 40 | 0 | 24/100 |

As is clear from Table 3, wire sample Nos. 1 to 33 of the present invention contained no more than 0.2 ppm of S and no more than 0.1 ppm of Se or Te, with the total content of incidental impurities being held at very low levels (<1 ppm). Therefore, the ball forming at the tip of each wire had a relatively low hardness and did not undergo any signinificant increase in hardness as a result of the thermocompression that was applied to effect ball bonding. Consequently, the incidence of the ball damaging the bonding pad on each Si semiconductor chip during high-speed bonding was nearly zero. In addition, because of the incorporation of a rare earth element and/or Y in amounts within the limits of 0.5 and 3 ppm, the wire samples of the present invention were capable of withstanding exposure to repeated heat cycles such as are encountered by ICs in their operating environment with a minimum chance of breaking at the neck just above the bonded ball.

In contract with this high reliability of the samples of the present invention, the very fine wires of oxygen-free copper and electrorefined high-purity copper which contained relatively high levels of incidental impurities experienced an appreciable degree of work hardening at the ball after application of thermocompression and the hardened ball caused frequent damage to the bonding pad on each Si chip. The very fine wire made of the zone-refined high-purity copper that had very low levels of incidental impurities but which did not contain a rare earth element or Y as an alloying component also caused damage to the bonding pad at a very low incidence but, as is clear from Table 3, the wire broke frequently at the neck just above the bonded ball when it was subjected to repeated heat cycles.

In short, the very fine wire of Cu alloy prepared in accordance with the present invention can be used in high-speed ball bonding with a minimum chance of the bonding pad on a semiconductor chip being damaged by the ball forming at the tip of the wire. In addition, the wire bonded to the semiconductor chip will rarely break at the neck just above the bonded ball even if the chip is subjected to the repeated heat cycles which occur in the operating environment of ICs. Because of these features, the very fine wire of Cu alloy of the present invention has adequate potential for use as a practical alternative to the very fine Au wire which is currently employed in the bonding of semiconductor devices.

We claim:

1. A very fine wire for use in the bonding of a semiconductor device which is made of high-purity copper that contains no more than 0.1 ppm of each of S, Se and Te as an incidental impurity, with the total content of these and any other incidental impurities present being held at a level not exceeding 0.3 ppm.

2. A very fine wire for use in the bonding of a semiconductor device which is made of high-purity copper that contains 0.5-3 ppm of at least one alloying component selected from the group consisting of a rare earth element and Y, with the balance being Cu and incidental impurities which include no more than 0.2 ppm of S and no more than 0.1 ppm of Se or Te, the total content of these and any other incidental impurities present being held at a level not exceeding 1 ppm.

* * * * *